US012484248B2

(12) United States Patent
Xie et al.

(10) Patent No.: US 12,484,248 B2
(45) Date of Patent: Nov. 25, 2025

(54) SOURCE/DRAIN CONTACT AT TIGHT CELL BOUNDARY

(71) Applicant: INTERNATIONAL BUSINESS MACHINES CORPORATION, Armonk, NY (US)

(72) Inventors: Ruilong Xie, Niskayuna, NY (US); Nicholas Anthony Lanzillo, Wynantskill, NY (US); Brent A. Anderson, Jericho, VT (US); Reinaldo Vega, Mahopac, NY (US); Albert M. Chu, Nashua, NH (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 539 days.

(21) Appl. No.: 18/049,297

(22) Filed: Oct. 25, 2022

(65) Prior Publication Data

US 2024/0136414 A1 Apr. 25, 2024
US 2024/0234523 A9 Jul. 11, 2024

(51) Int. Cl.
*H10D 64/01* (2025.01)
*H01L 23/528* (2006.01)
(Continued)

(52) U.S. Cl.
CPC ..... *H10D 30/6729* (2025.01); *H01L 23/5286* (2013.01); *H10D 30/014* (2025.01);
(Continued)

(58) Field of Classification Search
CPC .. H10D 30/014; H10D 30/43; H10D 30/6735; H10D 62/121; H10D 64/01;
(Continued)

(56) References Cited

U.S. PATENT DOCUMENTS 9,570,395 B1 2/2017 Sengupta
10,586,765 B2 3/2020 Smith
(Continued)

OTHER PUBLICATIONS

Chava et al., "Backside power delivery as a scaling knob for future systems", Proceedings of SPIE, Proc. of SPIE vol. 10962, Event: SPIE Advanced Lithography, 2019, San Jose, California, United States, © 2019 SPIE, 7 pages.
(Continued)

*Primary Examiner* — Ajay Ojha
*Assistant Examiner* — Sandra Milena Rodriguez Villanu
(74) *Attorney, Agent, or Firm* — Yuanmin Cai

(57) ABSTRACT

Embodiments of present invention provide a semiconductor structure. The semiconductor structure includes a semiconductor wafer having a first transistor and a second transistor; a first source/drain (S/D) contact of the first transistor; a second S/D contact of the second transistor; and a cut region between the first S/D contact and the second S/D contact, wherein the cut region includes a liner of a first dielectric material and a filler of a second dielectric material that is different from the first dielectric material, the liner lining at least a part of the first S/D contact and a part of the second S/D contact, and the filler being directly adjacent to the liner and between the first S/D contact and the second S/D contact. A method of manufacturing the semiconductor structure is also provided.

20 Claims, 12 Drawing Sheets

(51) Int. Cl.
   *H10D 30/01* (2025.01)
   *H10D 30/43* (2025.01)
   *H10D 30/67* (2025.01)
   *H10D 62/10* (2025.01)
   *H10D 62/13* (2025.01)

(52) U.S. Cl.
   CPC ......... *H10D 30/43* (2025.01); *H10D 30/6735* (2025.01); *H10D 62/121* (2025.01); *H10D 62/151* (2025.01); *H10D 64/01* (2025.01)

(58) Field of Classification Search
   CPC ........... H10D 30/6757; H10D 30/6729; H10D 84/0186; H10D 30/6219; H10D 84/013; H10D 84/017; H10D 84/0149; H10D 30/501; H10D 84/0151; H10D 84/0188; H01L 21/76895; H01L 21/76897; H01L 23/481; H01L 23/485; H01L 23/535; H01L 23/5226; H01L 21/02603; H01L 23/5286; H01L 21/743
   See application file for complete search history.

(56) References Cited

U.S. PATENT DOCUMENTS

| | | |
|---|---|---|
| 10,636,739 B2 | 4/2020 | Beyne |
| 10,672,708 B2 | 6/2020 | Fan |
| 10,700,207 B2 | 6/2020 | Chen |
| 11,121,086 B2 | 9/2021 | Hiblot |
| 11,158,580 B2 | 10/2021 | Sio |
| 2020/0105671 A1 | 4/2020 | Lai |
| 2021/0408231 A1* | 12/2021 | Huang ................ H01L 23/485 |
| 2022/0020666 A1 | 1/2022 | Van Dal |
| 2022/0115510 A1 | 4/2022 | Yu |
| 2022/0148969 A1 | 5/2022 | Xie |
| 2022/0157722 A1 | 5/2022 | Bouche |
| 2022/0181197 A1 | 6/2022 | Tao |
| 2022/0181258 A1 | 6/2022 | Liebmann |

OTHER PUBLICATIONS

Gupta et al., "Buried Power Rail Integration with Si FinFETs for CMOS Scaling beyond the 5 nm Node", © 2020 IEEE, 2 pages.

Hossen et al., "Power Delivery Network (PDN) Modeling for Backside-PDN Configurations With Buried Power Rails and μTSVs", IEEE Transactions on Electron Devices, vol. 67, No. 1, Jan. 2020, pp. 11-17.

Prasad et al., "Buried Power Rails and Back-side Power Grids: Arm® CPU Power Delivery Network Design Beyond 5nm", © 2019 IEEE, IEDM19, pp. 19.1.1-19.1.4.

Schor, "Intel Announces 20Å Node: RibbonFET Devices, PowerVia, 2024 Ramp", Jul. 26, 2021, WikiChip Fuse, 7 pages.

* cited by examiner

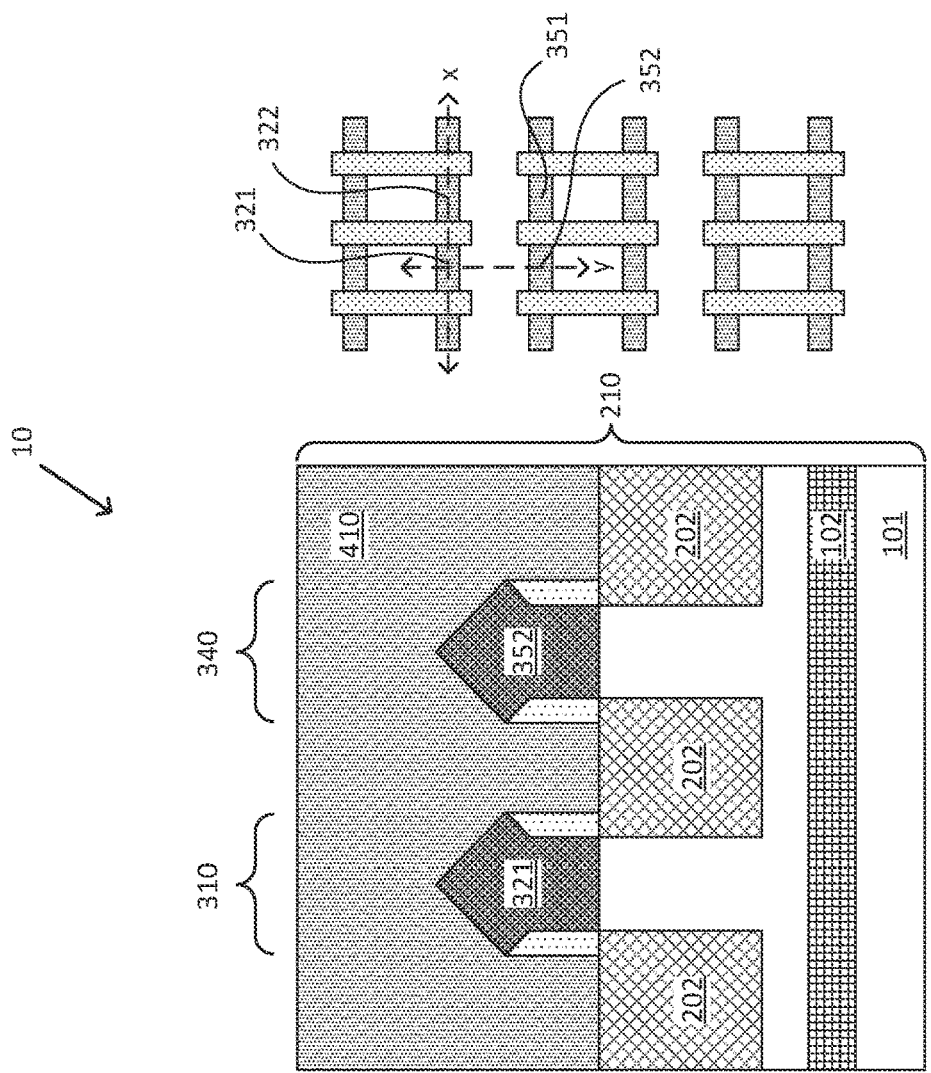
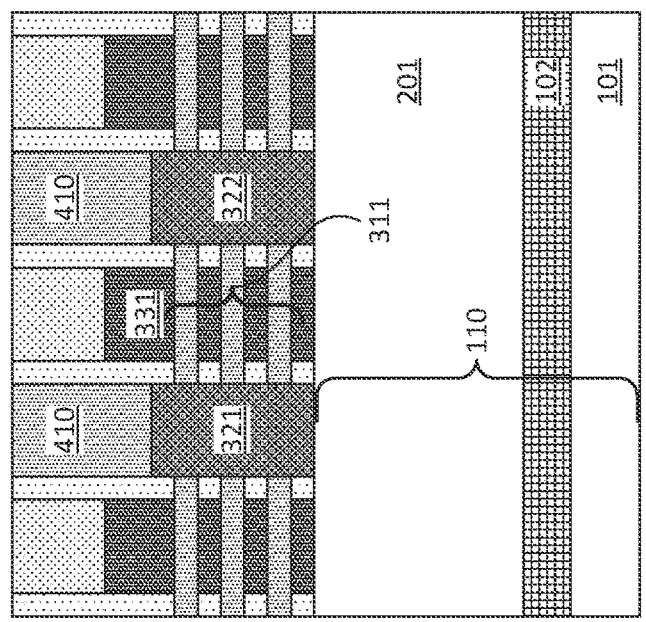
FIG. 1A
FIG. 1B
FIG. 1C

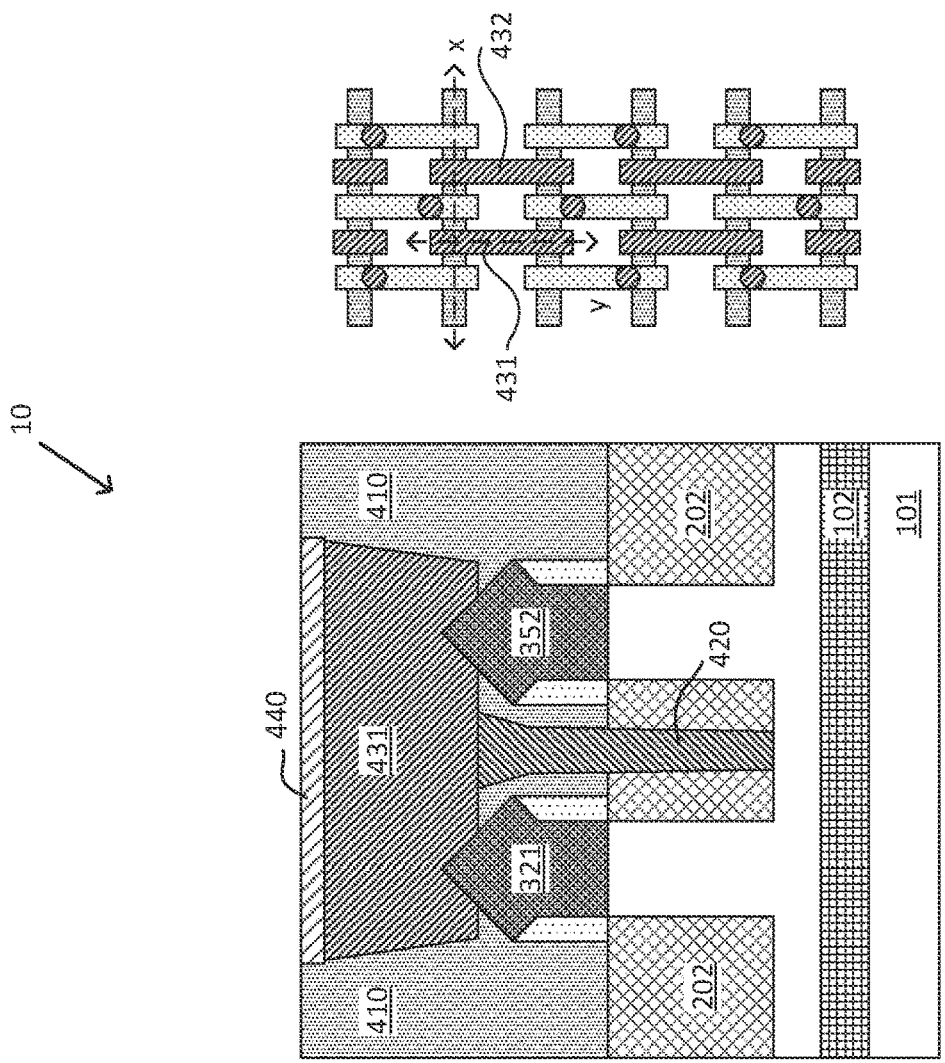
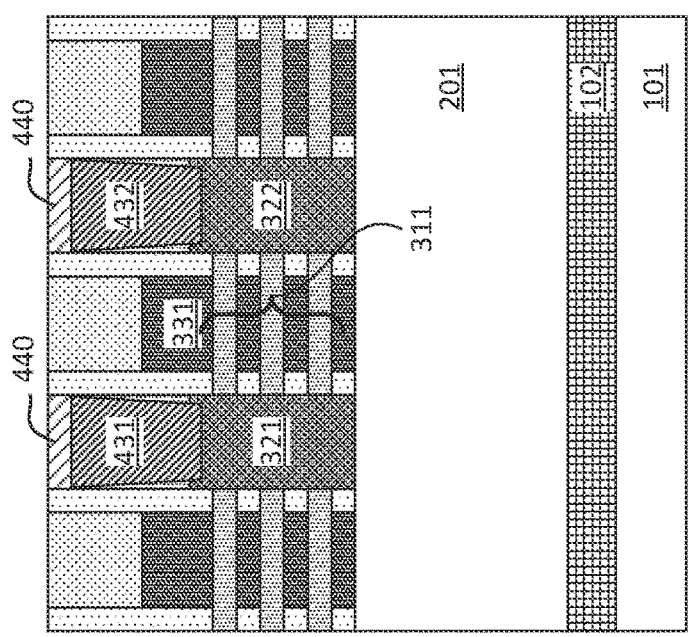
FIG. 2A
FIG. 2B
FIG. 2C

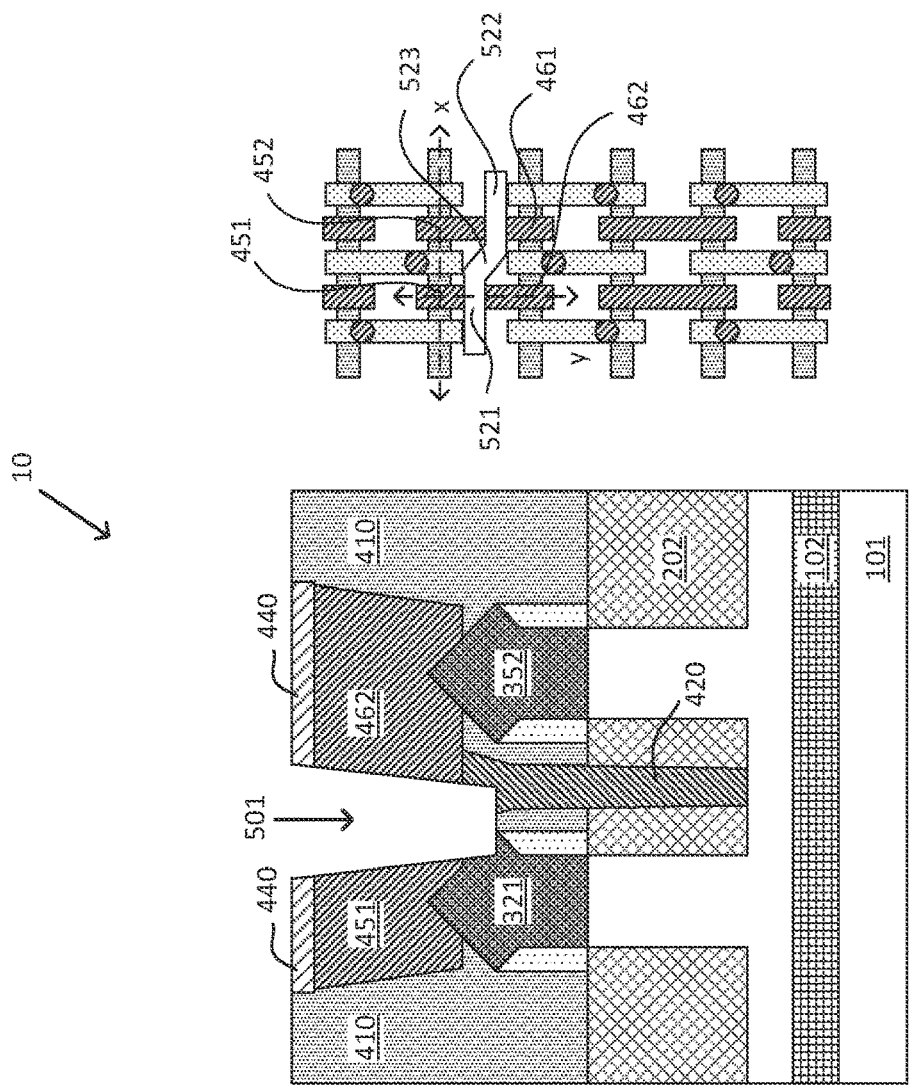
FIG. 3C
FIG. 3B
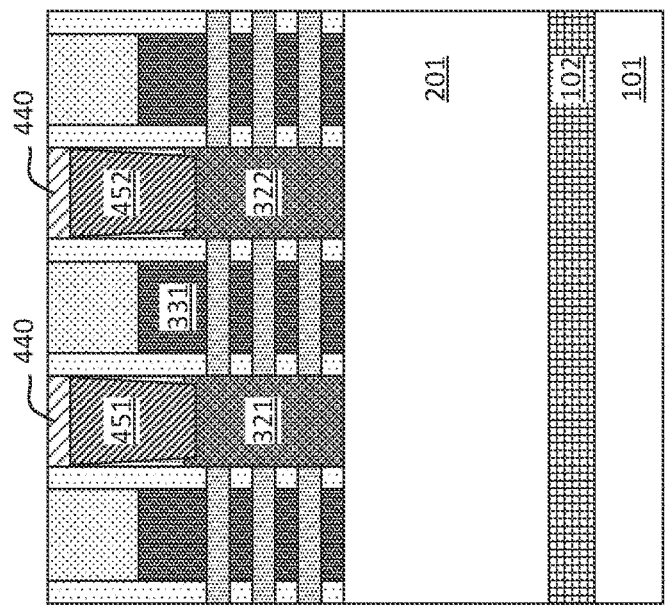
FIG. 3A

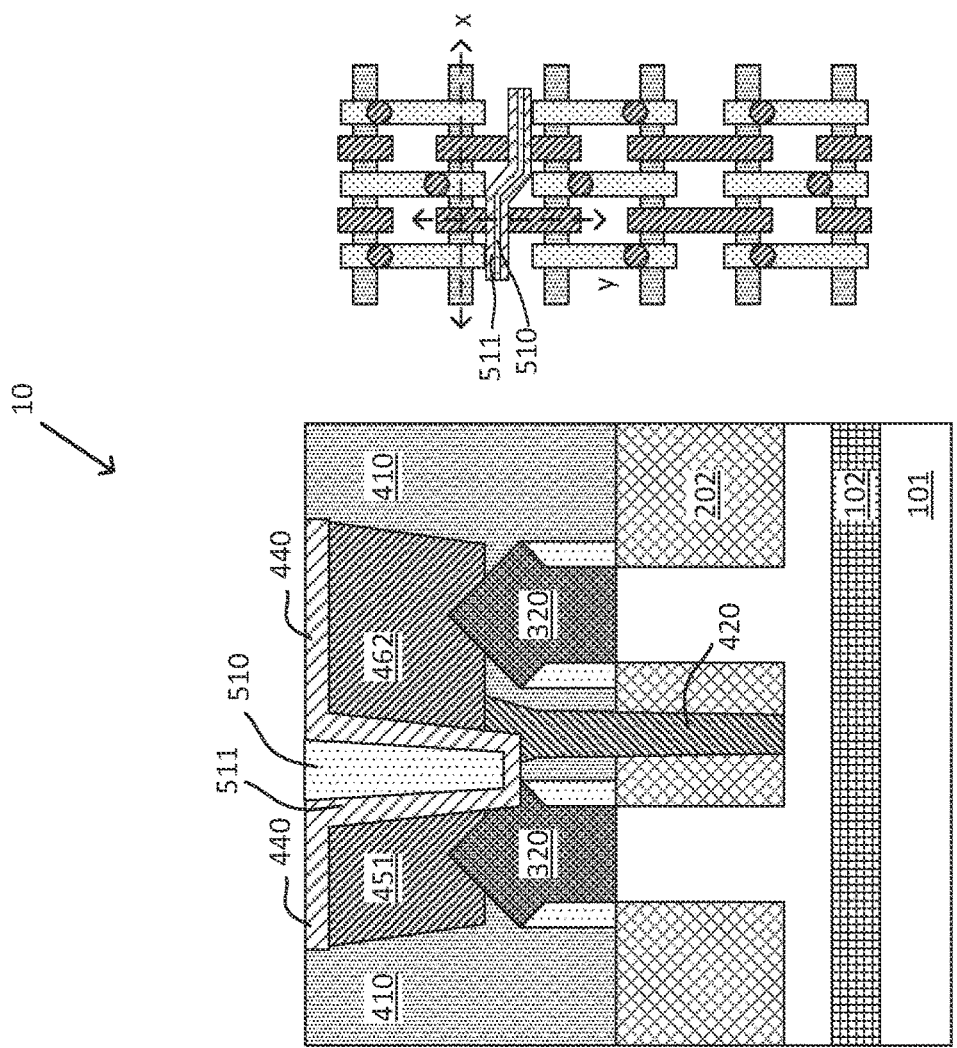
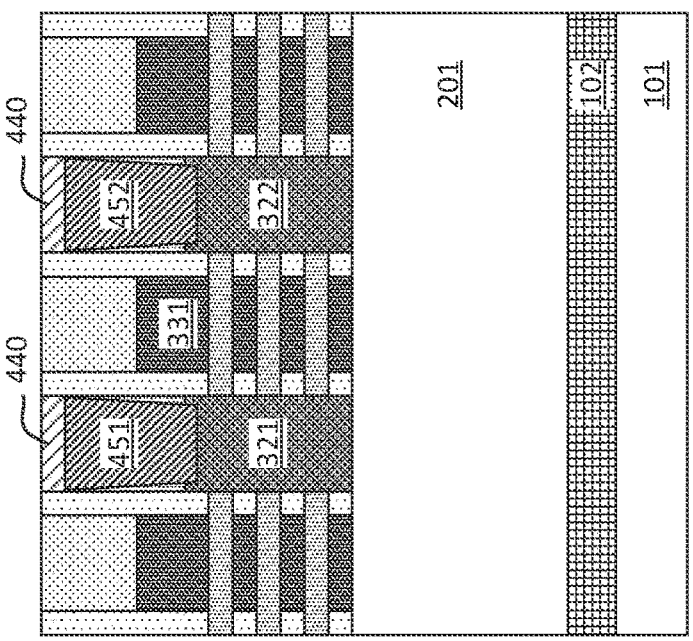
FIG. 4A
FIG. 4B
FIG. 4C

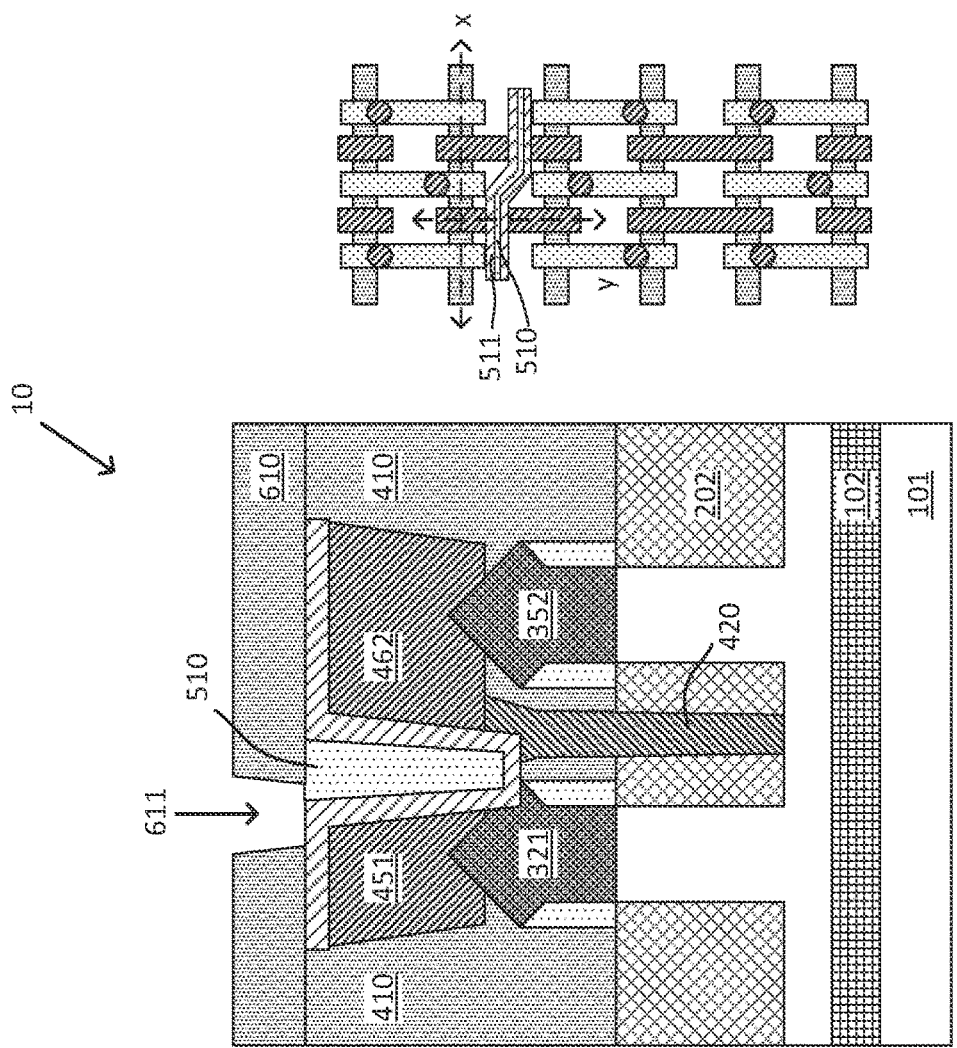
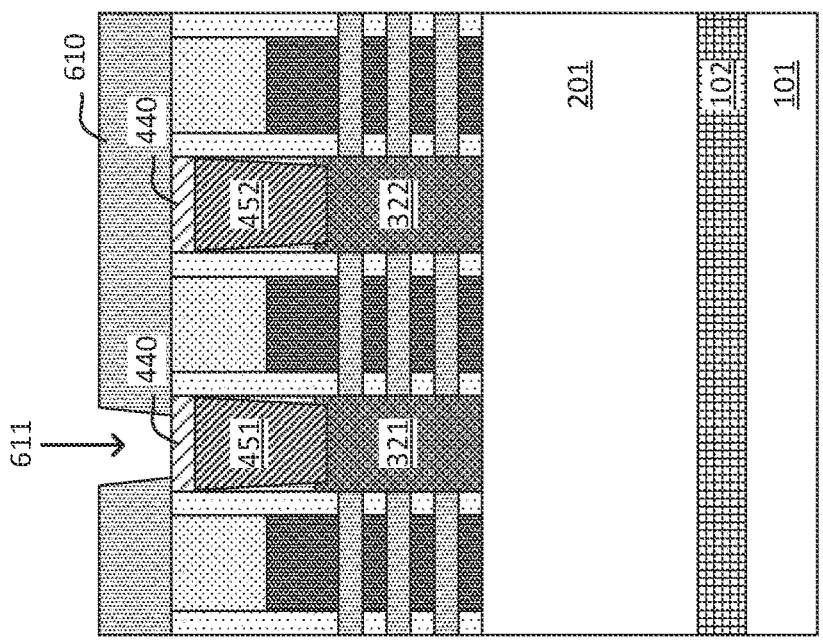
FIG. 5C
FIG. 5B
FIG. 5A

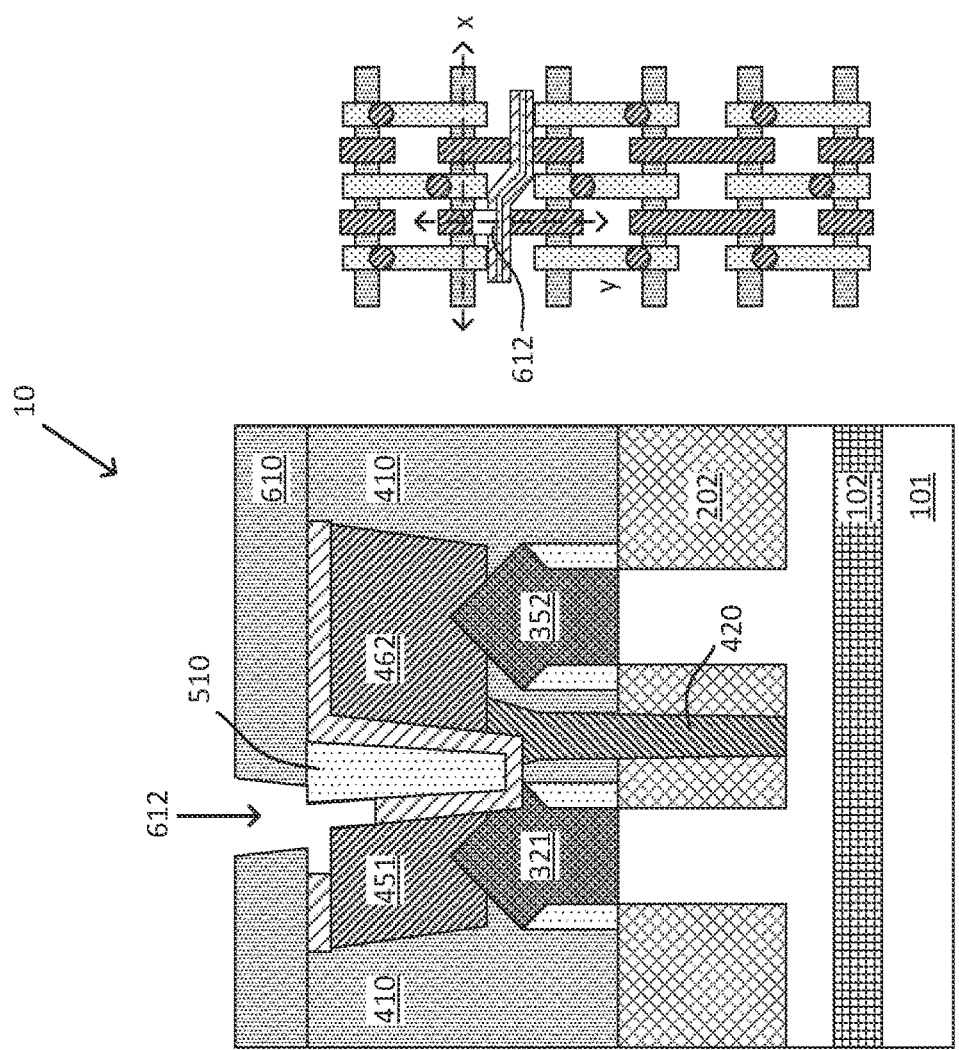
FIG. 6B
FIG. 6C
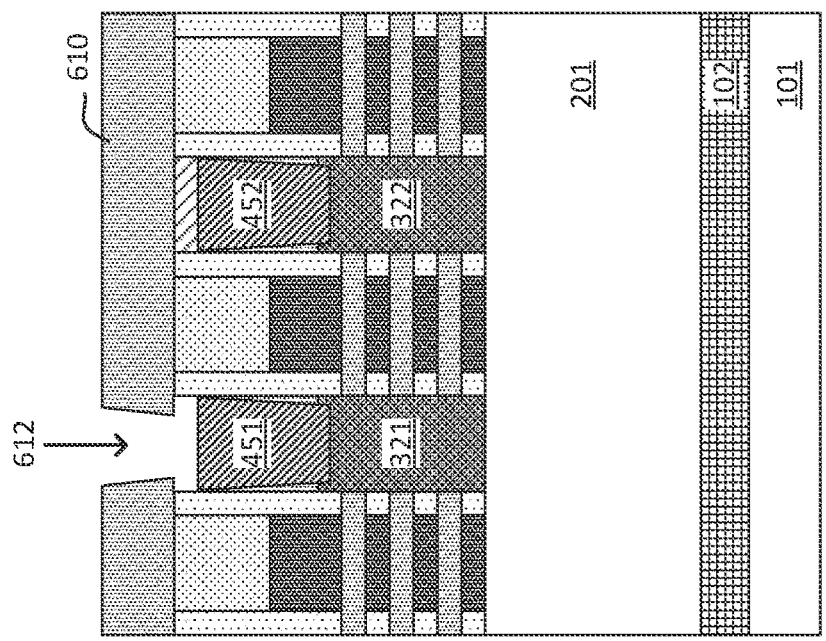
FIG. 6A

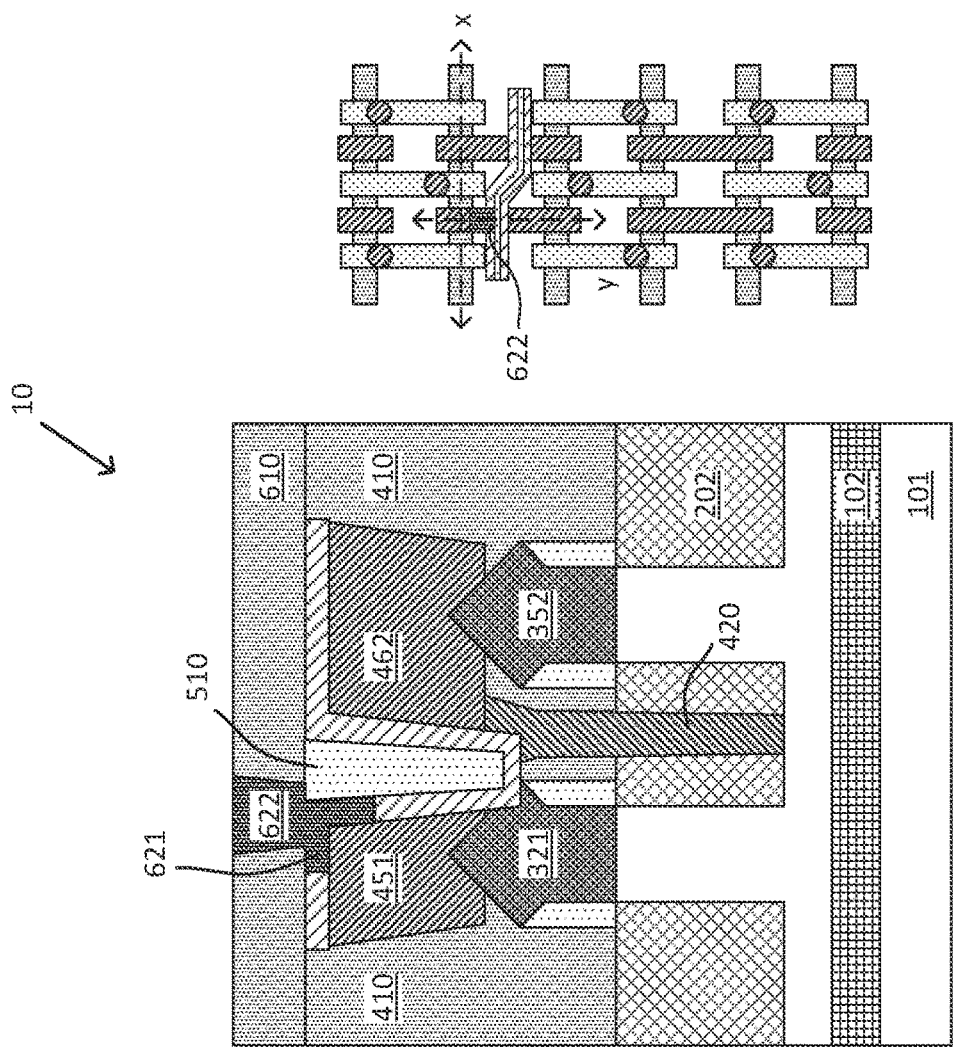
FIG. 7B
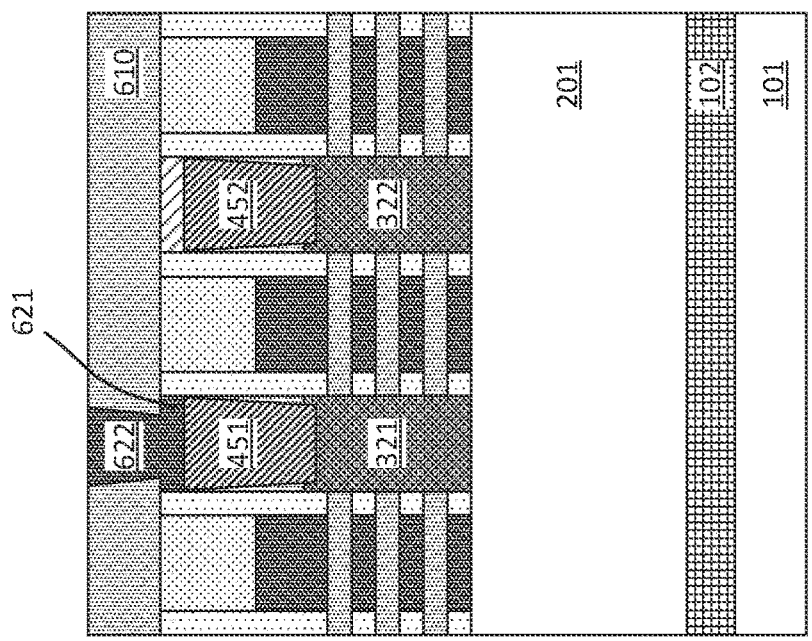
FIG. 7A
FIG. 7C

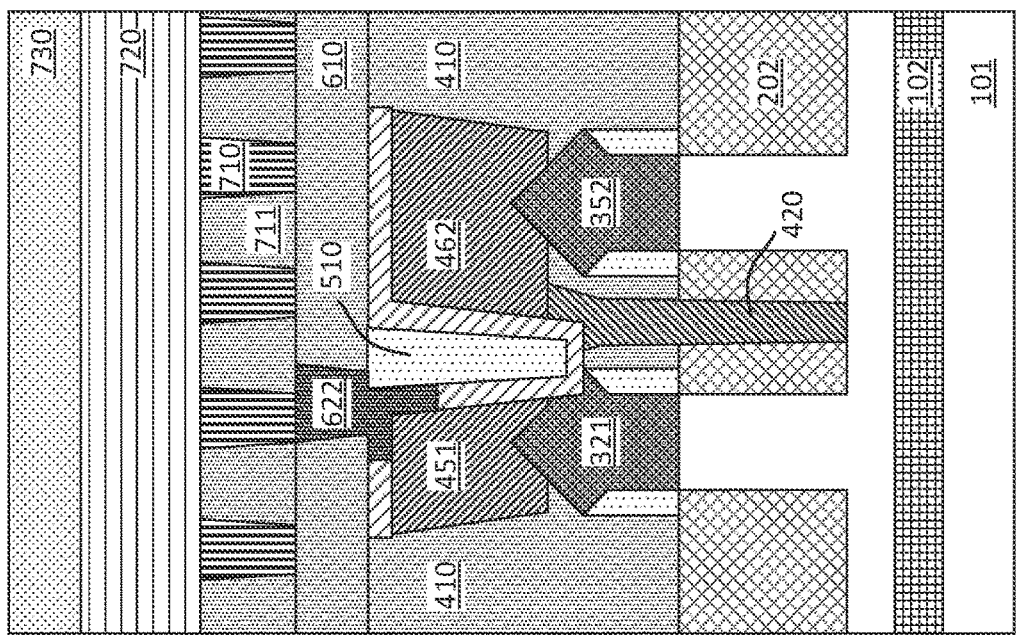
FIG. 8B
FIG. 8C
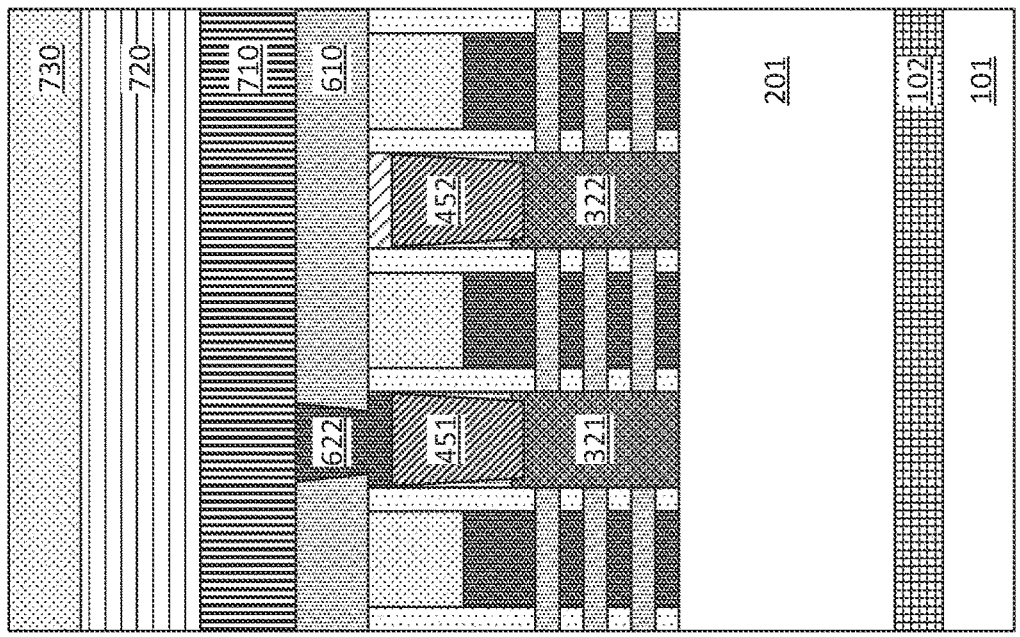
FIG. 8A

SOURCE/DRAIN CONTACT AT TIGHT CELL BOUNDARY

BACKGROUND

The present application relates to manufacturing of semiconductor integrated circuits. More particularly, it relates to forming S/D contact at tight cell boundary and the S/D contact structure formed thereby.

As semiconductor industry moves towards smaller node, for example 7-nm node and beyond, field-effect-transistors (FETs) are aggressively scaled in order to fit into the reduced footprint or real estate, which is often dictated by the node size, with increased device density. In addition, backside power distribution network (BSPDN) is introduced as a mean to further enhance the device density.

Generally, BSPDN is designed to provide power to backside power rail (BSPR) at the backside of the wafer, and the BSPR in-turn provides the power from the BSPDN to active front-end-of-line (FEOL) devices such as FETs through via bar and/or via to backside-power-rail (VBPR). The via bar or VBPR runs between active devices, often in the cell boundary area, resulting tight spacing to form contacts to the source/drain of different cells without causing short.

SUMMARY

Embodiments of present invention provide a semiconductor structure. The semiconductor structure includes a semiconductor wafer having a first transistor and a second transistor; a first source/drain (S/D) contact of the first transistor; a second S/D contact of the second transistor; and a cut region between the first S/D contact and the second S/D contact, wherein the cut region includes a liner of a first dielectric material and a filler of a second dielectric material that is different from the first dielectric material, the liner lining at least a part of the first S/D contact and a part of the second S/D contact, the filler being directly adjacent to the liner and between the first S/D contact and the second S/D contact.

In one embodiment, the first S/D contact connects a first S/D region of the first transistor to a back-end-of-line (BEOL) interconnect at a frontside of the wafer through a via contact.

In another embodiment, the second S/D contact connects a second S/D region of the second transistor to a backside power distribution network (BSPDN) through a via to backside-power-rail (VBPR), the VBPR extending through a shallow trench isolation (STI) layer.

In one embodiment, the via contact connects to the first S/D contact of the first transistor through a metal extension, the metal extension being at an edge of the first S/D contact and covering partially both a top and a sidewall of the first S/D contact.

In another embodiment, a vertical portion of the metal extension is directly between the first S/D contact and the filler.

In one embodiment, the cut region is a first cut region, and the semiconductor structure further includes a second cut region, the second cut region being between a second S/D contact of the first transistor and a first S/D contact of the second transistor, wherein the first cut region and the second cut region are not aligned in a straight line.

Embodiments of present invention also provide a method of forming a semiconductor structure. The method includes forming an initial source/drain (S/D) contact connecting to both a first S/D region of a first transistor and a second S/D region of a second transistor; creating a cut region, the cut region cutting the initial S/D contact into a first S/D contact connecting to the first S/D region of the first transistor and a second S/D contact connecting to the second S/D region of the second transistor; lining the cut region with a liner of a first dielectric material; filling the cut region with a filler of a second dielectric material, the filler being directly adjacent to the liner; removing a portion of the liner of the first dielectric material, selective to the filler of the second dielectric material, at an edge of the first S/D contact; forming a metal extension at the edge of the first S/D contact; and forming a via contact connecting to the metal extension.

In one embodiment, removing the portion of the liner of the first dielectric material creates an opening that exposes partially a top and a sidewall of the first S/D contact at the edge thereof.

In another embodiment, forming the metal extension includes filling the opening with a conductive material to cover partially the top and the sidewall of the first S/D contact.

In yet one embodiment, the initial S/D contact connects to a via to backside-power-rail (VBPR) between the first transistor and the second transistor, and wherein creating the cut region creates the first S/D contact that is isolated from the VBPR and the second S/D contact that is connected to the VBPR.

In one embodiment, the method further includes forming a backside power distribution network (BSPDN) connecting to the VBPR that is connected to the second S/D contact of the second transistor.

In another embodiment, the method further includes forming an interconnect of a back-end-of-line (BEOL) connecting to the via contact that is connected to the first S/D contact, through the metal extension, of the first transistor.

In one embodiment, the cutting region extends to an area between a second S/D contact of the first transistor and a first S/D contact of the second transistor in a non-straight manner.

BRIEF DESCRIPTION OF THE DRAWINGS

The present invention will be understood and appreciated more fully from the following detailed description of embodiments of present invention, taken in conjunction with accompanying drawings of which:

FIGS. 1A, 1B, and 1C to FIGS. 11A, 11B, and 11C are demonstrative illustrations of different cross-sectional views of a semiconductor structure in several steps of manufacturing thereof according to embodiments of present invention.

Figure 9C:
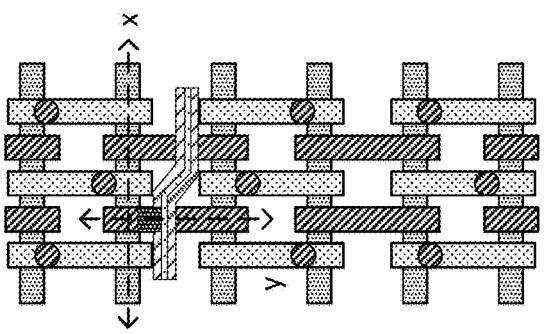

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to different structural orientations of the semiconductor structures shown in the drawings, XYZ Cartesian coordinates may be provided in some of the drawings. The terms "vertical" or "vertical direction" or "vertical height" as used herein denote a Z-direction of the Cartesian coordinates shown in the drawings, and the terms "horizontal" or "horizontal direction" or "lateral direction" as used herein denote an X-direction and/or a Y-direction of the Cartesian coordinates shown in the drawings.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIGS. 1A, 1B, and 1C are demonstrative illustrations of different cross-sectional views of a semiconductor structure 10 in a step of manufacturing thereof according to one embodiment of present invention. The semiconductor structure 10 is demonstratively illustrated to include multiple sets of nanosheet transistors although embodiments of present invention are not limited in this aspect and may be applied to other types of transistors and/or active devices.

More specifically, FIG. 1A illustrates a cross-sectional view of the semiconductor structure 10 along a dashed line X as illustrated in FIG. 1C. In other words, the cross-sectional view in FIG. 1A is made across the gate in a direction parallel to the nanosheets. FIG. 1B illustrates a cross-sectional view of the semiconductor structure 10 along a dashed line Y as illustrated in FIG. 1C. In other words, the cross-sectional view in FIG. 1B is made across the S/D region in a direction parallel to the gate. FIG. 1C is a top view of the semiconductor structure 10. More particularly, for the sake of clarity and not causing overcrowding, only key elements such as, for example, nanosheets, gates, and S/D regions of the semiconductor structure 10 are selectively illustrated in FIG. 1C. Other elements, such as dielectric cap layer, sidewall spacers, etc., may not necessarily be illustrated in the drawing to the extent that their omitting from the drawing does not hinder the description of embodiments of present invention, although some of these elements do exist as well.

Similarly, FIGS. 2A, 2B, and 2C to FIGS. 11A, 11B, and 11C illustrate cross-sectional reviews of the semiconductor structure 10, at various manufacturing stages, in a manner corresponding to FIGS. 1A, 1B, and 1C.

Embodiments of present invention provide forming the semiconductor structure 10 that includes a semiconductor wafer 210 that may include at least a first transistor 310 and a second transistor 340. More particularly, the first transistor 310 may include a stack of nanosheets 311, a gate 331 surrounding the stacks of nanosheets 311, and a first source/drain (S/D) region 321 and a second S/D region 322 next to the gate 331. The first S/D region 321 and the second S/D region 322 may be epitaxially formed at the two ends of the stack of nanosheets 311. Similar to the first transistor 310, the second transistor 340 may include a stack of nanosheets, a gate surrounding the stack of nanosheets, and a first and a second S/D regions at the two ends of the stack of nanosheets. However, for the sake of simplicity without overcrowding the drawing, only the first and second S/D regions 351 and 352 of the second transistor 340 are illustrated in FIG. 1B and/or FIG. 1C. Moreover, the first S/D region 321 and the second S/D region 322 of the first transistor 310, and the first and second S/D regions 351 and 352 of the second transistor 340, may be covered on the top and sides thereof by a dielectric layer such as an interlevel-dielectric (ILD) layer 410.

In one embodiment, the first transistor 310 may be a transistor of a first cell and the second transistor 340 may be a transistor of a second cell neighboring the first cell, and the first and second cells may have a very tight cell boundary, that is, very short distance between active regions from the two neighboring cells, which makes forming independent contacts to the first S/D region 321 of the first transistor 310 and the second S/D region 352 of the second transistor 340 in the current art very difficult, if not impossible, without causing short.

In one embodiment, the first transistor 310 and the second transistor 340 may be formed on top of a substrate 110. The substrate 110 may be, for example, a bulk silicon (Si) substrate, a bulk germanium (Ge) substrate, a silicon-on-insulator (501) substrate, or a stack of semiconductor and/or insulator layers. For example, the substrate 110 may include a Si substrate 201 on top of a layer 102 which may be an etch stop layer such as a layer of insulator (e.g. SiO2) or a layer of semiconductor (e.g. SiGe). The layer 102 may in-turn be on top of a bulk Si substrate 101. A shallow-trench-isolation (STI) layer 202 may be formed in the Si substrate 201.

FIGS. 2A, 2B, and 2C are demonstrative illustrations of different cross-sectional views of the semiconductor structure 10 in a step of manufacturing thereof, following the step illustrated in FIGS. 1A, 1B, and 1C, according to one embodiment of present invention. More particularly, embodiments of present invention provide forming a via to backside-power-rail (VBPR) 420 in the ILD layer 410 between, but not in direct contact with, the first S/D region 321 of the first transistor 310 and the second S/D region 352 of the second transistor 340. In one embodiment, the VBPR 420 may extend through one of the STI layer 202 into the Si substrate 201. The VBPR may sometimes be known as via-bar to backside-power-rail.

Furthermore, embodiments of present invention provide forming an initial S/D contact 431 connecting to, for example in contact with, the first S/D region 321 of the first transistor 310 and the second S/D region 352 of the second transistor 340. Moreover, the initial S/D contact 431 may be made in contact with the VBPR 420. Also, embodiments of present invention may provide forming an initial S/D contact 432 connecting to or in contact with the second S/D region 322 of the first transistor 310 and the first S/D region 351 of the second transistor 340. A dielectric cap layer 440 may be formed to cover the top surfaces of the initial S/D contacts 431 and 432.

FIGS. 3A, 3B, and 3C are demonstrative illustrations of different cross-sectional views of the semiconductor structure 10 in a step of manufacturing thereof, following the step illustrated in FIGS. 2A, 2B, and 2C, according to one embodiment of present invention. More particularly, embodiments of present invention provide performing a cutting process through, for example, a selective etching process such as a lithographic patterning process to cut the initial S/D contacts 431 and 432 thereby creating a cut region 501. The cut region 501 may include a first cut region 521 that cuts the initial S/D contact 431 into a first S/D contact 451 of the first transistor 310 and a second S/D contact 462 of the second transistor 340. While the second S/D contact 462 of the second transistor 340 may continue to be connected to or in contact with the VBPR 420, the first S/D contact 451 of the first transistor 310 may be separated or isolated from the VBPR 420.

The cut region 501 may also include a second cut region 522 that cuts the initial S/D contact 432 into a second S/D contact 452 of the first transistor 310 and a first S/D contact 461 of the second transistor 340. In one embodiment, the second cut region 522 may be parallel to and connected with the first cut region 521 but may not align with the first cut region 521 in a straight line. The first cut region 521 and the second cut region 522 may be connected by a third cut region 523 in-between. In other words, the second cut region 522 may be not in a straight extension of the first cut region 521 and the first cut region 521 may extend in a non-straight manner to the third cut region 523 and then to the second cut region 522. Hereinafter, the terms of first and second cut regions 521 and 522 may also be used to include any liner and filler formed therein, as being described below in more details.

FIGS. 4A, 4B, and 4C are demonstrative illustrations of different cross-sectional views of the semiconductor structure 10 in a step of manufacturing thereof, following the step illustrated in FIGS. 3A, 3B, and 3C, according to one embodiment of present invention. More particularly, embodiments of preset invention provide lining the cut region 501 with a liner 511 of a first dielectric material. In one embodiment, the first dielectric material of the liner 511 may be a same material as that of the dielectric cap layer 440. Embodiments of present invention provide subsequently filling any remaining space or opening in the cut region 501, between the first S/D contact 451 of the first transistor 310 and the second S/D contact 462 of the second transistor 340, with a filler 510 of a second dielectric material. In other words, the filler 510 may be formed directly adjacent to the liner 511. For example, the filler 510 may be formed in the first cut region 521 between the first S/D contact 451 of the first transistor 310 and the second S/D contact 462 of the second transistor 340. The filler 510 may also be formed in the second cut region 522 between the second S/D contact 452 of the first transistor 310 and the first S/D contact 461 of the second transistor 340. Excessive materials, such as the first dielectric material of the liner 511 and the second dielectric material of the filler 510, above the dielectric cap layer 440 may be removed through a chemical-mechanic-polishing (CMP) process.

FIGS. 5A, 5B, and 5C are demonstrative illustrations of different cross-sectional views of the semiconductor structure 10 in a step of manufacturing thereof, following the step illustrated in FIGS. 4A, 4B, and 4C, according to one embodiment of present invention. More particularly, embodiments of present invention provide forming a dielectric layer 610 on top of the ILD layer 410, the dielectric cap layer 440, the liner 511 and the filler 510. One or more openings such as an opening 611 may be created through a lithographic patterning and etching process for forming a via contact. The opening 611 may expose at most a portion of the filler 510 and may expose portions of the liner 511 and the dielectric capping layer 440 around an edge or corner of the first S/D contact 451 of the first transistor 310. Exposing only a portion of the filler 510 ensures that the liner 511 and dielectric capping layer 440 surrounding the second S/D contact 462 of the second transistor 340 will not be exposed to a subsequent etching process that are designed to expose and form contact only to the first S/D contact 451 of the first transistor 310, as being descried below in more details. The relatively large size of the filler 510 provides sufficiently large error of margin for the above purpose during the formation of the opening 611.

FIGS. 6A, 6B, and 6C are demonstrative illustrations of different cross-sectional views of the semiconductor structure 10 in a step of manufacturing thereof, following the step illustrated in FIGS. 5A, 5B, and 5C, according to one embodiment of present invention. More particularly, embodiments of present invention provide performing a selective etching process to remove a portion of the dielectric capping layer 440 and a portion of the liner 511 around the edge or corner of the first S/D contact 451 of the first transistor 310. The etching process is selective relative to the second dielectric material of the filler 510, therefore leaving the filler 510 substantially un-etched. The selective etching process creates an L-shaped opening 612 that exposes a portion of the top and sidewall of the first S/D contact 451 of the first transistor 310. In the meantime, the dielectric capping layer 440 and the liner 511 on top and sidewall of the second S/D contact 462 of the second transistor 340 are fully protected by the dielectric layer 610.

FIGS. 7A, 7B, and 7C are demonstrative illustrations of different cross-sectional views of the semiconductor structure 10 in a step of manufacturing thereof, following the step illustrated in FIGS. 6A, 6B, and 6C, according to one embodiment of present invention. More particularly, embodiments of present invention provide filling the opening 612 with a conductive material such as, for example, ruthenium (Ru), cobalt (Co), tungsten (W), copper (Cu), etc. and optionally with a thin metal adhesion layer such as tantalum-nitride (TaN) or titanium-nitride (TiN), to form a via contact 622 and a metal extension 621 underneath the via contact 622. The conductive material of the via contact 622 and the metal extension 621 may be filled through a selective metal growth process such as, for example, an atomic-layer-deposition (ALD) process, a chemical-vapor-deposition (CVD) process, and/or a physical-vapor-deposition (PVD) process. The metal extension 621 may be an L-shaped metal extension. After the filling, a CMP process may subsequently be applied to remove any excessive conductive material on top of the dielectric layer 610.

The metal extension 621 may partially contact both a top and a sidewall of the first S/D contact 451, at a corner thereof, of the first transistor 310. For example, a vertical portion of the metal extension 621 may be directly between the first S/D contact 451 and the filler 510. Consequently, the via contact 622 connects to the first S/D contact 451 of the first transistor 310 through the metal extension 621 of conductive material.

FIGS. 8A, 8B, and 8C are demonstrative illustrations of different cross-sectional views of the semiconductor structure 10 in a step of manufacturing thereof, following the step illustrated in FIGS. 7A, 7B, and 7C, according to one embodiment of present invention. More particularly, embodiments of present invention may continue to form or built one or more metal levels and a back-end-of-line (BEOL) structure on top of the first transistor 310 and the second transistor 340 at the frontside of the wafer 210. For example, a metal level 710 may be formed on top of the dielectric layer 610 and the via contact 622. The metal level 710 may be embedded in a dielectric layer 711. Additional BEOL structure 720 may be formed on top of the metal level 710 and the dielectric layer 711. After that, a carrier wafer 730 may be bonded onto the BEOL structure 720 such that the device under manufacturing may be flipped for further processing at the backside of the wafer 210.

Figure 9B:
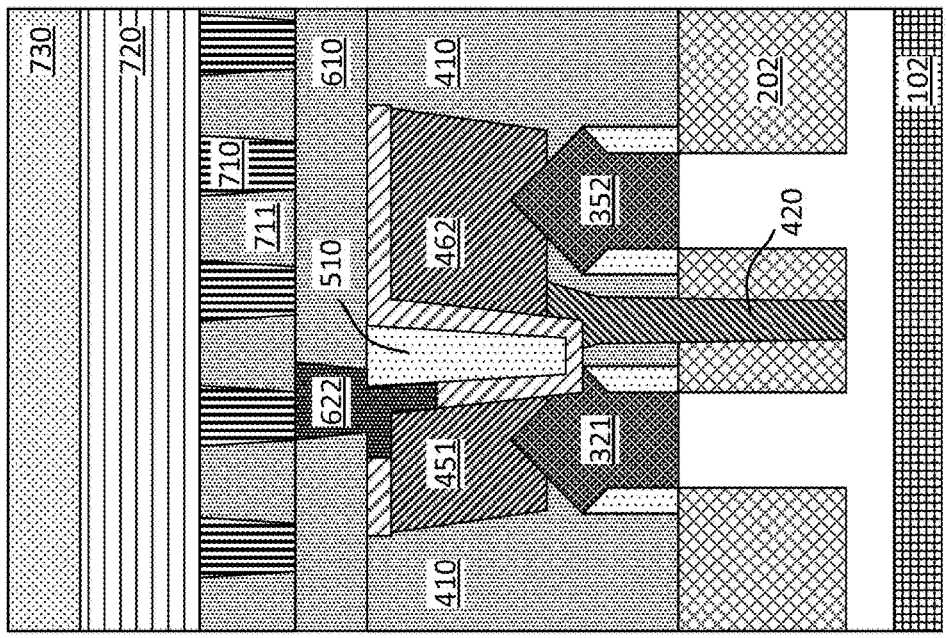
Figure 9A:
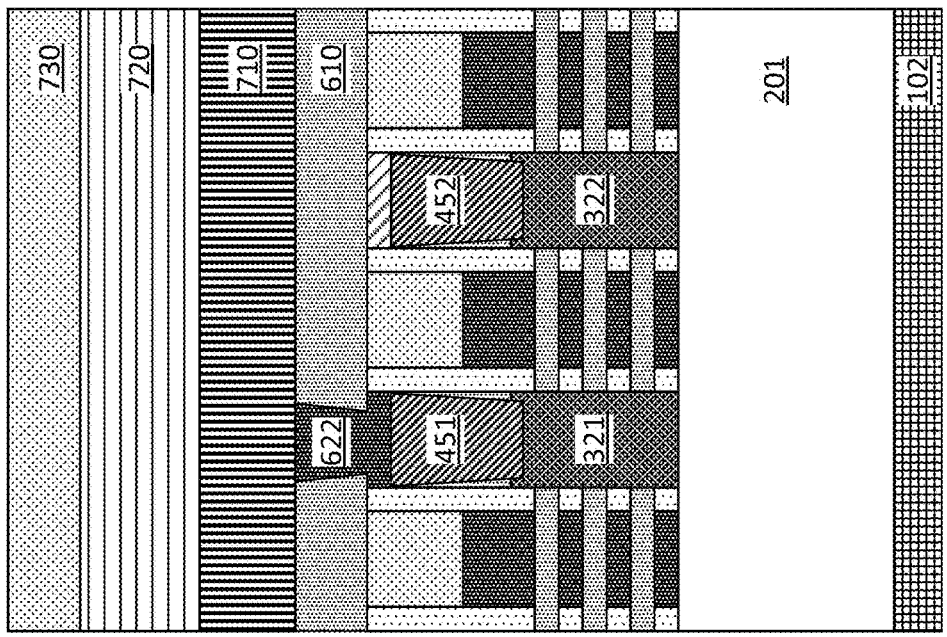

FIGS. 9A, 9B, and 9C are demonstrative illustrations of different cross-sectional views of the semiconductor structure 10 in a step of manufacturing thereof, following the step illustrated in FIGS. 8A, 8B, and 8C, according to one embodiment of present invention. More particularly, embodiments of present invention may remove, such as through a combination of wafer grinding, CMP, dry and wet etch process, the Si bulk substrate 101 and for better process control the removing process may stop at the layer 102 which may be for example an etch stop layer.

Figure 10C:
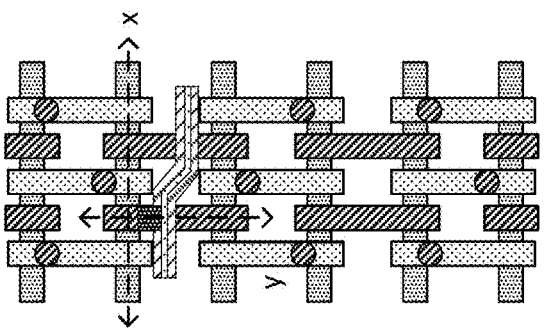
Figure 10B:
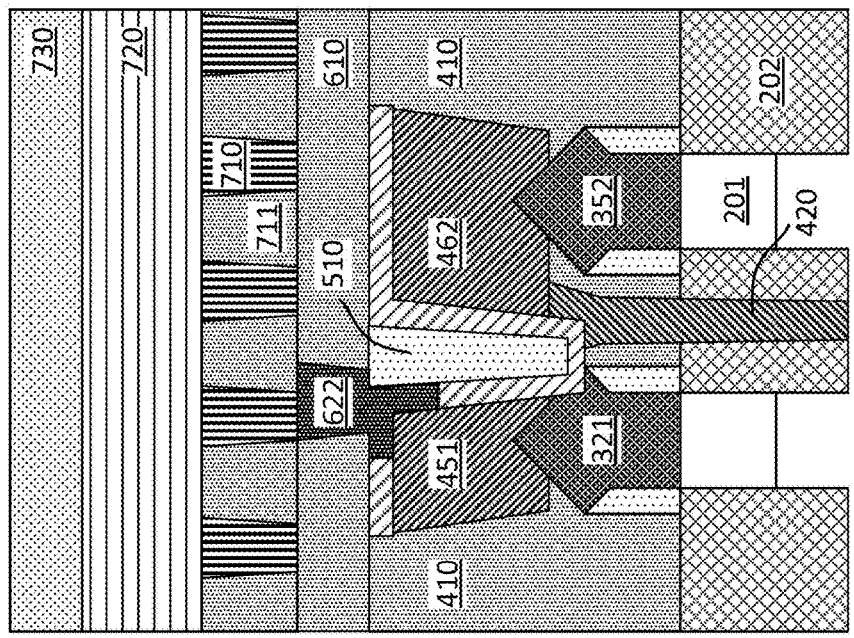
Figure 10A:
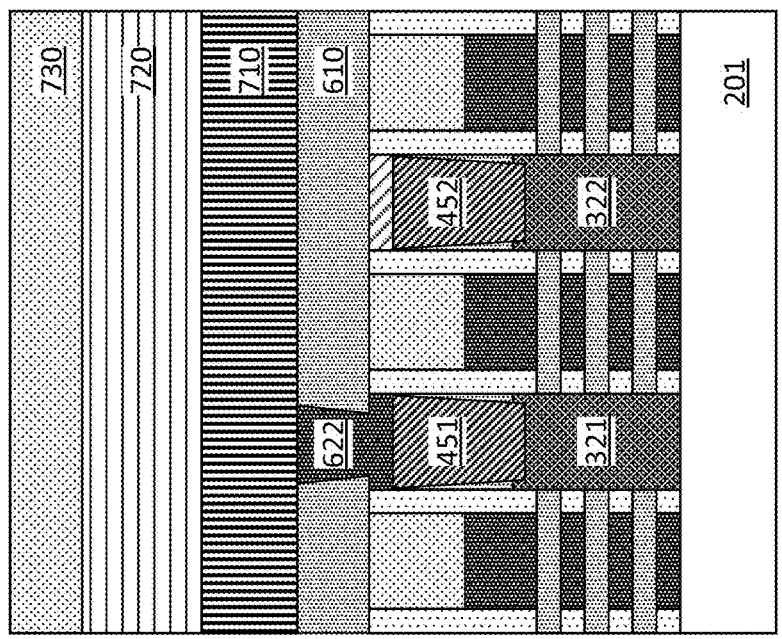

FIGS. 10A, 10B, and 10C are demonstrative illustrations of different cross-sectional views of the semiconductor structure 10 in a step of manufacturing thereof, following the step illustrated in FIGS. 9A, 9B, and 9C, according to one embodiment of present invention. More particularly, embodiments of present invention may continue to remove the layer 102, which as being described above may be an etch stop layer of semiconductor or insulator material, and may further continue to thin-down or etch the Si substrate 201. For example, in one embodiment, a portion of the Si substrate 201 may be removed until a portion of the STI layer 202 is exposed.

Figure 11C:
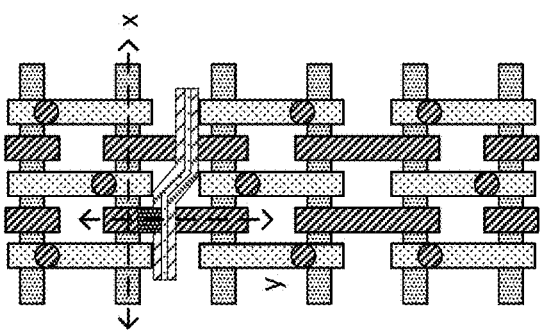
Figure 11B:
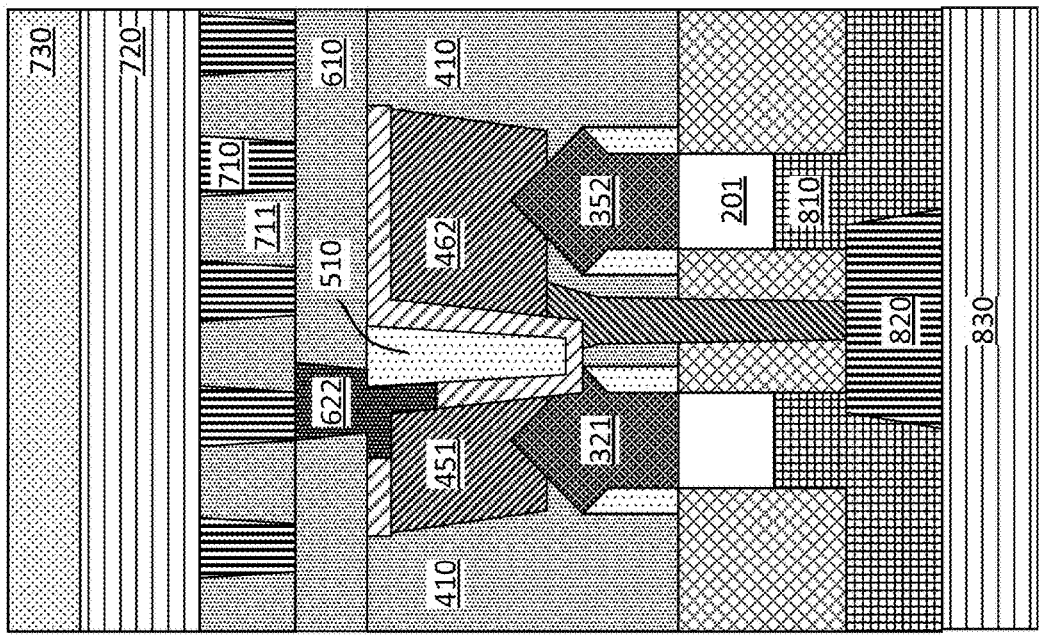
Figure 11A:
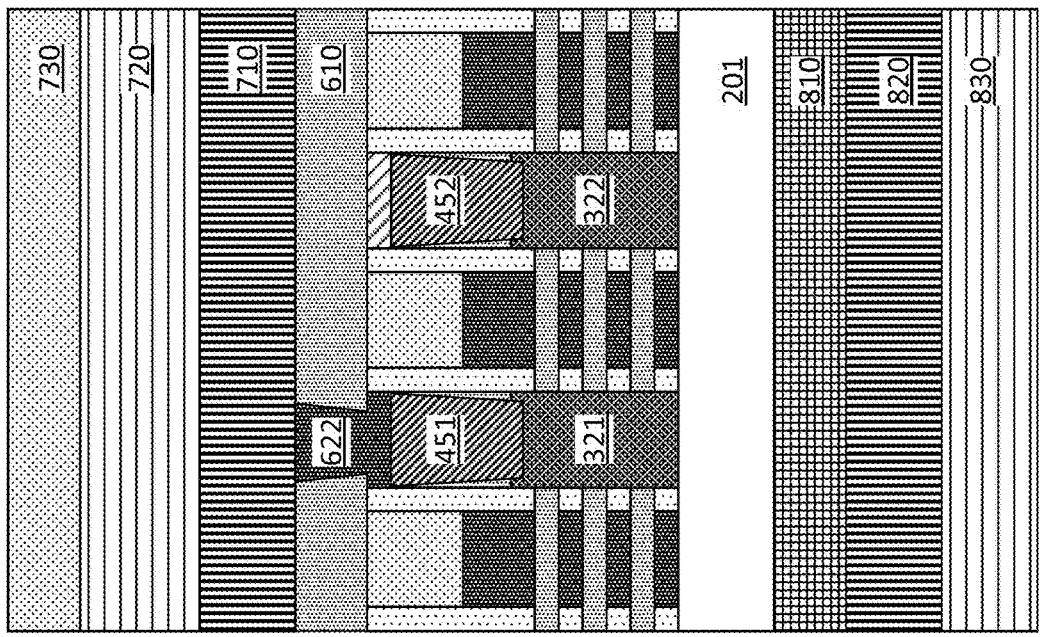

FIGS. 11A, 11B, and 11C are demonstrative illustrations of different cross-sectional views of the semiconductor structure 10 in a step of manufacturing thereof, following the step illustrated in FIGS. 10A, 10B, and 10C, according to one embodiment of present invention. More particularly, embodiments of present invention may further include forming a backside interlevel dielectric (BILD) layer 810 on top of the Si substrate 201 (underneath the Si substrate 201 as is shown in FIG. 11A and FIG. 11B), one or more backside power rail (BSPR) 820 embedded in the BILD layer 810, and a backside power distribution network (BSPDN) 830 on top of the BSPR 820 and/or the BILD layer 810. The BSPR 820 may be formed to be in direct contact with the VBPR 420 thereby connecting the second S/D contact 462 of the second transistor 340 with the BSPDN 830.

Figure 12:
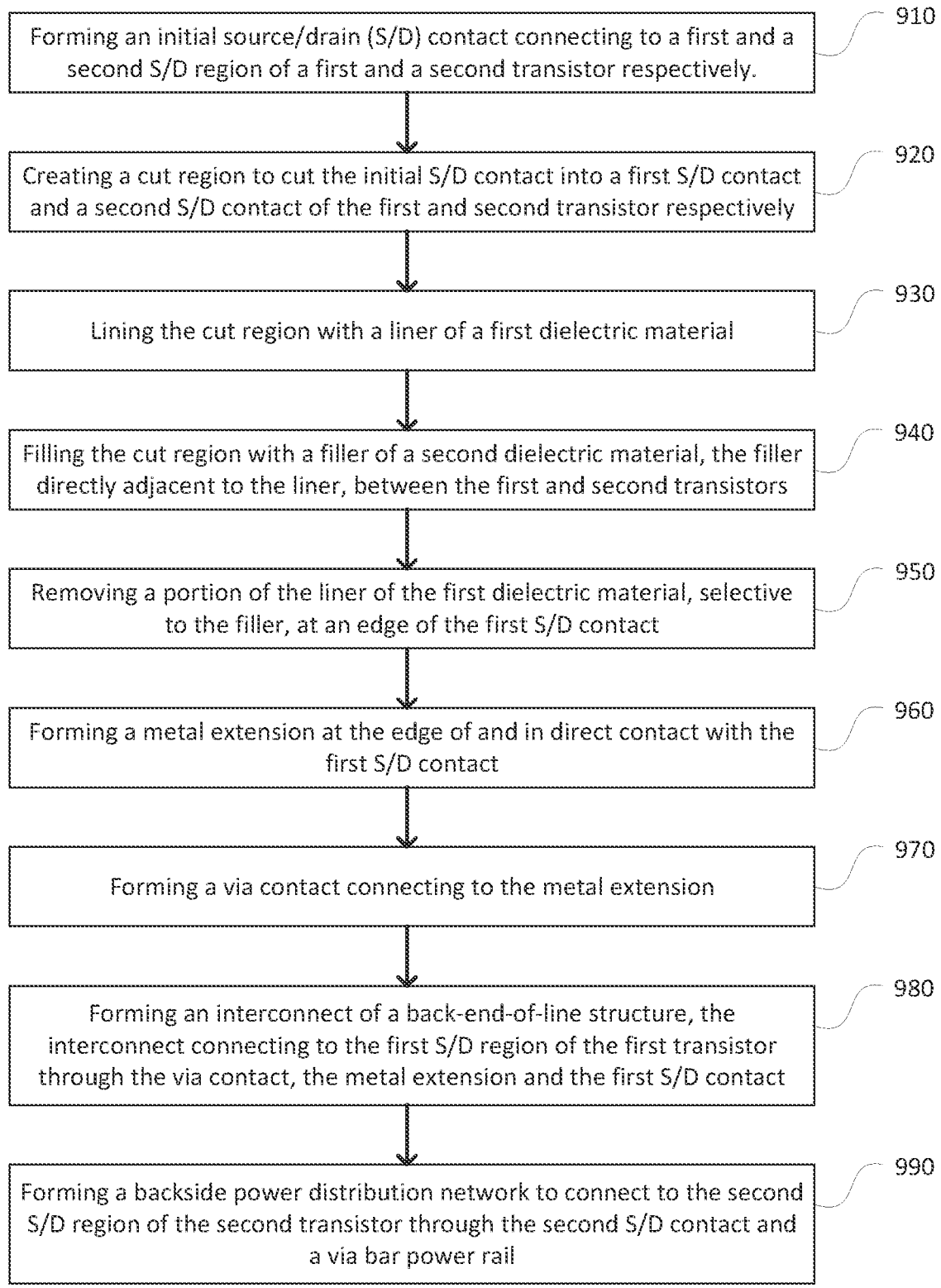
FIG. 12 is a demonstrative illustration of a flow-chart of a method of manufacturing a semiconductor structure according to embodiments of present invention.

FIG. 12 is a demonstrative illustration of a flow-chart of a method of manufacturing a semiconductor structure according to embodiments of present invention. The method includes (910) forming an initial source/drain (S/D) contact connecting to a first and a second S/D region of a first and a second transistor, respectively; (920) creating a cut region, the cut region cuts the initial S/D contact into a first S/D contact of a first transistor and a second S/D contact of a second transistor respectively; (930) lining the cut region with a liner of a first dielectric material; (940) filling the remaining space of the cut region with a filler of a second dielectric material, wherein the filler is directly adjacent to the liner and situates between the first and the second S/D regions of the first and the second transistor; (950) removing a portion of the liner of the first dielectric material, selective to the filler of the second dielectric material, at an edge or corner of the first S/D contact; (960) forming a metal extension at the edge or corner of and in direct contact with the first S/D contact; (970) forming a via contact connecting to the metal extension; (980) forming an interconnect of a back-end-of-line (BEOL) structure, the interconnect connecting to the first S/D region of the first transistor through the via contact, the metal extension, and the first S/D contact; and (990) forming a backside power distribution network (BSPDN) to connect to the second S/D region of the second transistor through the second S/D contact of the second transistor and a via bar power rail (VBPR) formed between the first and second S/D regions of the first and second transistors.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A semiconductor structure comprising:
   a semiconductor wafer having a first transistor and a second transistor;
   a first source/drain (S/D) contact of the first transistor;
   a second S/D contact of the second transistor; and
   a cut region between the first S/D contact and the second S/D contact,
   wherein the cut region includes a liner of a first dielectric material and a filler of a second dielectric material that is different from the first dielectric material, the liner lining at least a part of the first S/D contact and a part of the second S/D contact, the filler being in a solid state and directly adjacent to the liner and between the first S/D contact and the second S/D contact.

2. The semiconductor structure of claim 1, wherein the first S/D contact connects a first S/D region of the first transistor to a back-end-of-line (BEOL) interconnect at a frontside of the semiconductor wafer through a via contact.

3. The semiconductor structure of claim 1, wherein the second S/D contact connects a second S/D region of the second transistor to a backside power distribution network (BSPDN) through a via to backside-power-rail (VBPR), the VBPR extending through a shallow trench isolation (STI) layer.

4. The semiconductor structure of claim 2, wherein the via contact connects to the first S/D contact of the first transistor through a metal extension, the metal extension being at an edge of the first S/D contact and covering partially both a top and a sidewall of the first S/D contact.

5. The semiconductor structure of claim 4, wherein a vertical portion of the metal extension is directly between the first S/D contact and the filler.

6. The semiconductor structure of claim 1, wherein the cut region is a first cut region, further comprising a second cut region, the second cut region being between a second S/D contact of the first transistor and a first S/D contact of the second transistor, wherein the first cut region and the second cut region are not aligned in a straight line.

7. A method of forming a semiconductor structure comprising:
   forming an initial source/drain (S/D) contact connecting to both a first S/D region of a first transistor and a second S/D region of a second transistor;
   creating a cut region, the cut region cutting the initial S/D contact into a first S/D contact connecting to the first S/D region of the first transistor and a second S/D contact connecting to the second S/D region of the second transistor;
   lining the cut region with a liner of a first dielectric material;
   filling the cut region with a filler of a second dielectric material, the filler being in a solid state and directly adjacent to the liner;
   removing a portion of the liner of the first dielectric material, selective to the filler of the second dielectric material, at an edge of the first S/D contact;
   forming a metal extension at the edge of the first S/D contact; and
   forming a via contact connecting to the metal extension.

8. The method of claim 7, wherein removing the portion of the liner of the first dielectric material creates an opening that exposes partially a top and a sidewall of the first S/D contact at the edge thereof.

9. The method of claim 8, wherein forming the metal extension comprises filling the opening with a conductive material to cover partially the top and the sidewall of the first S/D contact.

10. The method of claim 7, wherein the initial S/D contact connects to a via to backside-power-rail (VBPR) between the first transistor and the second transistor, and wherein creating the cut region creates the first S/D contact that is isolated from the VBPR and the second S/D contact that is connected to the VBPR.

11. The method of claim 10, further comprising forming a backside power distribution network (BSPDN) connecting to the VBPR that is connected to the second S/D contact of the second transistor.

12. The method of claim 7, further comprising forming an interconnect of a back-end-of-line (BEOL) connecting to the via contact that is connected to the first S/D contact, through the metal extension, of the first transistor.

13. The method of claim 7, wherein the cut region extends to an area between a second S/D contact of the first transistor and a first S/D contact of the second transistor in a non-straight manner.

14. A semiconductor structure comprising:
    a semiconductor wafer having a first transistor and a second transistor;
    a first and a second source/drain (S/D) contact of the first transistor;
    a first and a second S/D contact of the second transistor;
    a first cut region between the first S/D contact of the first transistor and the second S/D contact of the second transistor; and
    a second cut region between the second S/D contact of the first transistor and the first S/D contact of the second transistor,
    wherein the second cut region is parallel to the first cut region but not in a straight extension of the first cut region.

15. The semiconductor structure of claim 14, wherein the first cut region includes a liner of a first dielectric material and a filler of a second dielectric material, the second dielectric material being different from the first dielectric material, the liner lining at least a part of the first S/D contact of the first transistor and a part of the second S/D contact of the second transistor, the filler being directly adjacent to the liner and between the first S/D contact of the first transistor and the second S/D contact of the second transistor.

16. The semiconductor structure of claim 15, wherein the first S/D contact of the first transistor connects a first S/D region of the first transistor to a back-end-of-line (BEOL) interconnect at a frontside of the semiconductor wafer through a via contact.

17. The semiconductor structure of claim 16, wherein the via contact connects to the first S/D contact of the first transistor through a metal extension, the metal extension being at an edge of the first S/D contact of the first transistor and covering partially a top and a sidewall of the first S/D contact of the first transistor.

18. The semiconductor structure of claim 17, wherein a vertical portion of the metal extension is directly between the first S/D contact of the first transistor and the filler.

19. The semiconductor structure of claim 14, wherein the second S/D contact of the second transistor connects a second S/D region of the second transistor to a backside power distribution network (BSPDN) through a via to backside-power-rail (VBPR), the VBPR extending through a shallow trench isolation (STI) layer.

20. The semiconductor structure of claim 14, wherein the first cut region and the second cut region are connected by a third cut region in a non-straight manner.

* * * * *